United States Patent
Lai

(10) Patent No.: US 11,984,889 B2
(45) Date of Patent: May 14, 2024

(54) SIGNAL GENERATION CIRCUIT, MICRO-CONTROLLER, AND CONTROL METHOD THEREOF

(71) Applicant: Nuvoton Technology Corporation, Hsinchu Science Park (TW)

(72) Inventor: Yun-Kai Lai, Hsinchu Science Park (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 129 days.

(21) Appl. No.: 17/833,970

(22) Filed: Jun. 7, 2022

(65) Prior Publication Data

US 2022/0407521 A1 Dec. 22, 2022

(30) Foreign Application Priority Data

Jun. 18, 2021 (TW) .................................. 110122278

(51) Int. Cl.
*H03M 1/66* (2006.01)
*H03K 19/17736* (2020.01)
(Continued)

(52) U.S. Cl.
CPC ... *H03K 19/17764* (2013.01); *H03K 19/1774* (2013.01); *H03K 19/1776* (2013.01); *H03K 19/17772* (2013.01); *H03M 1/808* (2013.01)

(58) Field of Classification Search
CPC .... H03M 1/66; H03M 1/1061; H03M 1/1076; H03M 1/661; H03M 1/1205;
(Continued)

(56) References Cited

U.S. PATENT DOCUMENTS 4,991,120 A * 2/1991 Vaiana ...................... G09G 5/06
358/518
5,198,818 A * 3/1993 Samueli .................. H03M 7/06
341/147
(Continued)

FOREIGN PATENT DOCUMENTS

| CN | 1791219 A | 6/2006 |
| TW | 200609746 A | 3/2006 |
| TW | 200821910 A | 5/2008 |

OTHER PUBLICATIONS

Office Action mailed Jun. 28, 2022 in TW Application No. 110122278, 4 pages.

*Primary Examiner* — Linh V Nguyen
(74) *Attorney, Agent, or Firm* — MUNCY, GEISSLER, OLDS & LOWE, P.C.

(57) ABSTRACT

A signal generation circuit including a first control circuit, a second control circuit, an arbiter circuit, and a digital-to-analog converter (DAC) circuit is provided. The first control circuit stores a first string of data. The first control circuit enables a first trigger signal in response to a first event occurring. The second control circuit stores a second string of data. The second control circuit enables a second trigger signal in response to a second event occurring. The arbiter circuit reads the first or second control circuit according to the order of priority to use the first string of data or the second string of data as a digital input in response to the first and second trigger signals being enabled. The DAC circuit converts the digital input to generate an analog output.

19 Claims, 3 Drawing Sheets

(51) Int. Cl.
  *H03K 19/1776*   (2020.01)
  *H03K 19/17764*  (2020.01)
  *H03K 19/17772*  (2020.01)
  *H03M 1/80*      (2006.01)

(58) Field of Classification Search
  CPC ...... H03M 7/3015; H03M 1/46; H03M 1/662;
  H03M 1/822; H03M 1/109; H03M
  1/0614; H03M 1/0612; H03M 1/1009;
  H03M 1/1215; H03M 1/1225; H03M
  1/1038
  USPC ............................ 341/11–121, 140, 141, 144
  See application file for complete search history.

(56) References Cited

U.S. PATENT DOCUMENTS

| | | | | |
|---|---|---|---|---|
| 5,682,159 | A * | 10/1997 | Proctor | H03M 1/0836 |
| 5,859,605 | A * | 1/1999 | Raghavan | G06J 1/00 |
| | | | | 341/131 |
| 6,411,647 | B1 * | 6/2002 | Chan | H04L 25/0276 |
| | | | | 341/130 |
| 6,438,434 | B1 * | 8/2002 | Kamiya | G10H 1/08 |
| | | | | 381/119 |
| 7,327,816 | B2 * | 2/2008 | Messier | G06F 1/0328 |
| | | | | 375/354 |
| 7,830,217 | B1 * | 11/2010 | Stein | H04L 27/365 |
| | | | | 332/144 |
| 9,230,532 | B1 * | 1/2016 | Lu | G10K 11/17855 |
| 9,941,894 | B1 * | 4/2018 | Gu | G01N 33/004 |
| 10,965,299 | B1 * | 3/2021 | Kim | H03M 1/76 |
| 2004/0264547 | A1 * | 12/2004 | Robinson | H03M 7/3015 |
| | | | | 375/132 |
| 2013/0214954 | A1 * | 8/2013 | Onishi | H03M 1/66 |
| | | | | 341/144 |
| 2017/0047917 | A1 | 2/2017 | Heo et al. | |
| 2022/0239303 | A1 * | 7/2022 | Wong | H03M 1/747 |
| 2022/0345121 | A1 * | 10/2022 | Lai | H03K 5/131 |

* cited by examiner

US 11,984,889 B2

SIGNAL GENERATION CIRCUIT, MICRO-CONTROLLER, AND CONTROL METHOD THEREOF

CROSS REFERENCE TO RELATED APPLICATIONS

This application claims priority of Taiwan Patent Application No. 110122278, filed on Jun. 18, 2021, the entirety of which is incorporated by reference herein.

BACKGROUND OF THE INVENTION

Field of the Invention

The invention relates to a signal generation circuit, and more particularly to a signal generation circuit that provides an analog signal.

Description of the Related Art

Generally, a signal generation circuit generates an output signal according to input data. The input data is provided by a specific data source. Generally, the data source can be changed by the intervention of a central processing unit (CPU). However, when the intervention times increases, it will consume the resources of the CPU and reduce system performance.

BRIEF SUMMARY OF THE INVENTION

In accordance with an embodiment of the disclosure, a signal generation circuit comprises a first control circuit, a second control circuit, an arbiter circuit, and a digital-to-analog converter (DAC) circuit. The first control circuit stores a first string of data. The first control circuit enables a first trigger signal in response to a first event occurring. The second control circuit stores a second string of data. The second control circuit enables a second trigger signal in response to a second event occurring. The arbiter circuit reads either the first or second control circuit according to the order of priority to use the first string of data or the second string of data as a digital input in response to the first and second trigger signals being enabled. The DAC circuit converts the digital input to generate an analog output.

In accordance with another embodiment of the disclosure, a micro-controller comprises a central processing unit (CPU), a first peripheral circuit, a first control circuit, a second control circuit, an arbiter circuit, a DAC circuit, and a second peripheral circuit. The first peripheral circuit is coupled to the CPU. The first control circuit is coupled to the first peripheral circuit and stores a first string of data. In response to a first event occurring in the first peripheral circuit, the first control circuit enables a first trigger signal. The second control circuit is coupled to the first peripheral circuit and stores a second string of data. In response to a second event occurring in the first peripheral circuit, the second control circuit enables a second trigger signal. The arbiter circuit reads either the first or second control circuit according to the order of priority to use the first string of data or the second string of data as a digital input in response to the first and second trigger signals being enabled. The DAC circuit converts the digital input to generate an analog output. The second peripheral circuit operates according to the analog output.

In accordance with a further embodiment of the disclosure, a control method applied in a micro-controller comprising a CPU is described in the following paragraph. In an initial period, the CPU is utilized to set a first peripheral circuit and activate a DAC circuit. In an operation period: a first string of data is written to a first control circuit, a second string of data is written to a second control circuit; a first trigger signal is enabled in response to a first event occurring in the first peripheral circuit; a second trigger signal is enabled in response to a second event occurring in the first peripheral circuit; either the first control circuit or the second control circuit is read according to the order of priority to use the first string of data or the second string of data as a digital input in response to the first and second trigger signals being enabled; and the digital input is converted to an analog output.

Control method may be practiced by the signal generation circuit or the micro-controller which has hardware or firmware capable of performing particular functions and may take the form of program code embodied in a tangible media. When the program code is loaded into and executed by an electronic device, a processor, a computer or a machine, the electronic device, the processor, the computer or the machine becomes a signal generation circuit or a micro-controller for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
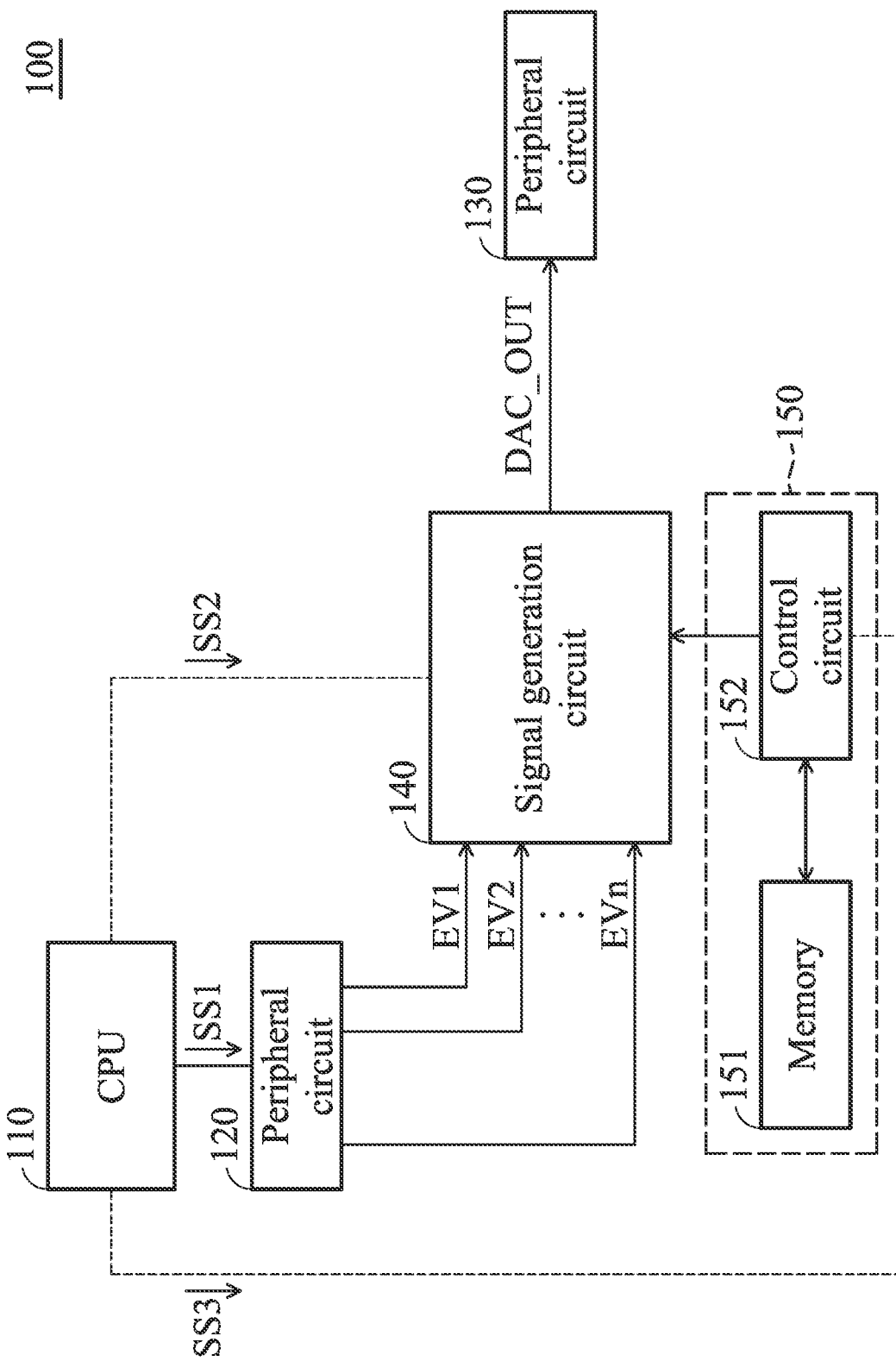
FIG. 1 is a schematic diagram of an exemplary embodiment of a micro-controller according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a micro-controller according to various aspects of the present disclosure. As shown in FIG. 1, the micro-controller 100 comprises a central processing unit (CPU) 110, peripheral circuits 120 and 130, and a signal generation circuit 140. In an initial period, the CPU 110 initializes the peripheral circuit 120 and the signal generation circuit 140. The disclosure does not limit how the CPU 110 initializes the peripheral circuit 120 and the signal generation circuit 140. In one embodiment, the CPU 110 may send a set signal SS1 to activate the logic circuits (not shown) in the peripheral circuit 120 and set the registers (not shown) of the peripheral circuit 120. Additionally, the CPU 110 may send a set signal SS2 to activate the signal generation circuit 140.

The peripheral circuit 120 is coupled between the CPU 110 and the signal generation circuit 140. In the initial period, the peripheral circuit 120 receives the set signal SS1 and sets the internal registers in the peripheral circuit 120 according to the set signal SS1. Next, in an operation period, the peripheral circuit 120 starts operating. In this embodiment, the operation of the peripheral circuit 120 does not require support from the CPU 110. In other words, when the peripheral circuit 120 operates, the CPU 110 may be in an idle state or enter a power-down mode. In the operation period, the peripheral circuit 120 performs at least one specific operation. After finishing the specific operation, the peripheral circuit 120 causes an event. In this embodiment, the peripheral circuit 120 may perform at least one specific operation to cause the events EV1~EVn.

The kinds of events EV1~EVn are not limited in the present disclosure. One of the events EV1~EVn is the same as another of the events EV1~EVn. For example, the event EV1 may be an overflow event which occurs when the counting value of the counter circuit (now shown) in the peripheral circuit 120 arrives a first target value. The event EV2 may be an overflow event which occurs when the counting value of the counter circuit (now shown) in the peripheral circuit 120 or the counting value of another counter circuit (not shown) in the peripheral circuit 120 arrives a second target value. The second target value may be different from the first target value. In this case, the events EV1 and EV2 belong to the same event, such as the overflow event.

In other embodiments, one of the events EV1~EVn may be different from another of the events EV1~EVn. For example, the event EV1 may be an overflow event caused by a counter circuit. In this case, the event EVn occurs when the level of a specific pin (not shown) in the peripheral circuit 120 is equal to a specific level, such as a high level or a low level. In some embodiments, at least one of the events EV1~EVn is caused by a software. In this case, the event EV1 may be caused when a specific software is executed or when a controller (not shown) in the peripheral circuit 120 executes a specific program code.

The signal generation circuit 140 retrieves digital data strings from a corresponding data source according to the events EV1~EVn and then converts the digital data string to generate an analog output DAC_OUT. Taking the events EV1 and EV2 as an example, when the event EV1 occurs, the signal generation circuit 140 retrieves a first string of data of a first data source and converts the first string of data to generate the analog output DAC_OUT. When the event EV2 occurs, the signal generation circuit 140 retrieves a second string of data of a second data source and converts the second string of data to generate the analog output DAC_OUT.

Since the signal generation circuit 140 reads a corresponding data source according to the occurrence of the event, it does not need the intervention of the CPU 110. Therefore, after initialing the peripheral circuit 120, the CPU 110 can enter a power-down mode to reduce the power consumption. In other embodiments, when the signal generation circuit 140 operates, the CPU is in an idle state. Additionally, since the signal generation circuit 140 does not require support from the CPU 110, the CPU 110 is capable of performing other operations. Therefore, the performance of the CPU 110 is increased.

Furthermore, since the signal generation circuit 140 generates the analog output according to the strings of data from different data sources, the signal generation circuit 140 is capable of generating waveforms with different slopes. For example, when the signal generation circuit 140 generates the analog output DAC_OUT according to many strings of data from a first data source, the analog output DAC_OUT has a first slope. When the signal generation circuit 140 generates the analog output DAC_OUT according to many strings of data from a second data source, the analog output DAC_OUT has a second slope. In this case, the first slope is different from the second slope.

The peripheral circuit 130 operates according to the analog output DAC_OUT. The type of analog output DAC_OUT is not limited in the present disclosure. In one embodiment, the analog output DAC_OUT is used as a reference voltage. In other embodiments, the micro-controller 100 further comprises a peripheral circuit 150. The peripheral circuit 150 comprises a memory 151 and a control circuit 152. In this case, the CPU 110 utilizes the set signal SS3 to direct the control circuit 152 to access the memory 151. The control circuit 152 moves a plurality of data strings stored in the memory 151 to a corresponding data source in the signal generation circuit 140.

Assume that the memory 151 stores a first string of data, a second string of data, a third string of data, and a fourth string of data. The CPU 110 utilizes the set signal SS3 to assign the first string of data and the third string of data to a first data source in the signal generation circuit 140 and assign the second string of data and the fourth string of data to a second data source in the signal generation circuit 140. In one embodiment, the control circuit 152 may store the first string of data and the second string of data in the first and second data sources in the signal generation circuit 140. Then, when the event EV1 occurs, the signal generation circuit 140 reads and converts the first string of data stored in the first data source. When the signal generation circuit 140 starts to convert the first string of data, the control circuit 152 moves the third string of data to the first data source to replace the first string of data. At this time, if the event EV1 occurs again, the signal generation circuit 140 reads and converts the third string of data stored in the first data source. However, if the event EV2 occurs, the signal generation circuit 140 reads and converts the second string of data stored in the second data source. When the signal generation circuit 140 starts to convert the second string of data, the control circuit 152 moves the fourth string of data to the second data source to replace the second string of data.

The kind of memory 151 is not limited in the present disclosure. In one embodiment, the memory 151 is a static random access memory (SRAM). The structure of the control circuit 152 is not limited in the present disclosure. In one embodiment, the control circuit 152 is a peripheral direct memory access (PDAM) controller.

In an initial period, the CPU 110 utilizes the set signals SS1~SS3 to initialize the peripheral circuit 120, the signal generation circuit 140, and the peripheral circuit 150. Then, in an operation period, the peripheral circuit 120, the signal generation circuit 140, and the peripheral circuit 150 operate according to the information which is provided by the CPU 110 in the initial period. In the operation period, the operations of the peripheral circuit 120, the signal generation circuit 140, and the peripheral circuit 150 do not require support from the CPU 110.

Figure 2:
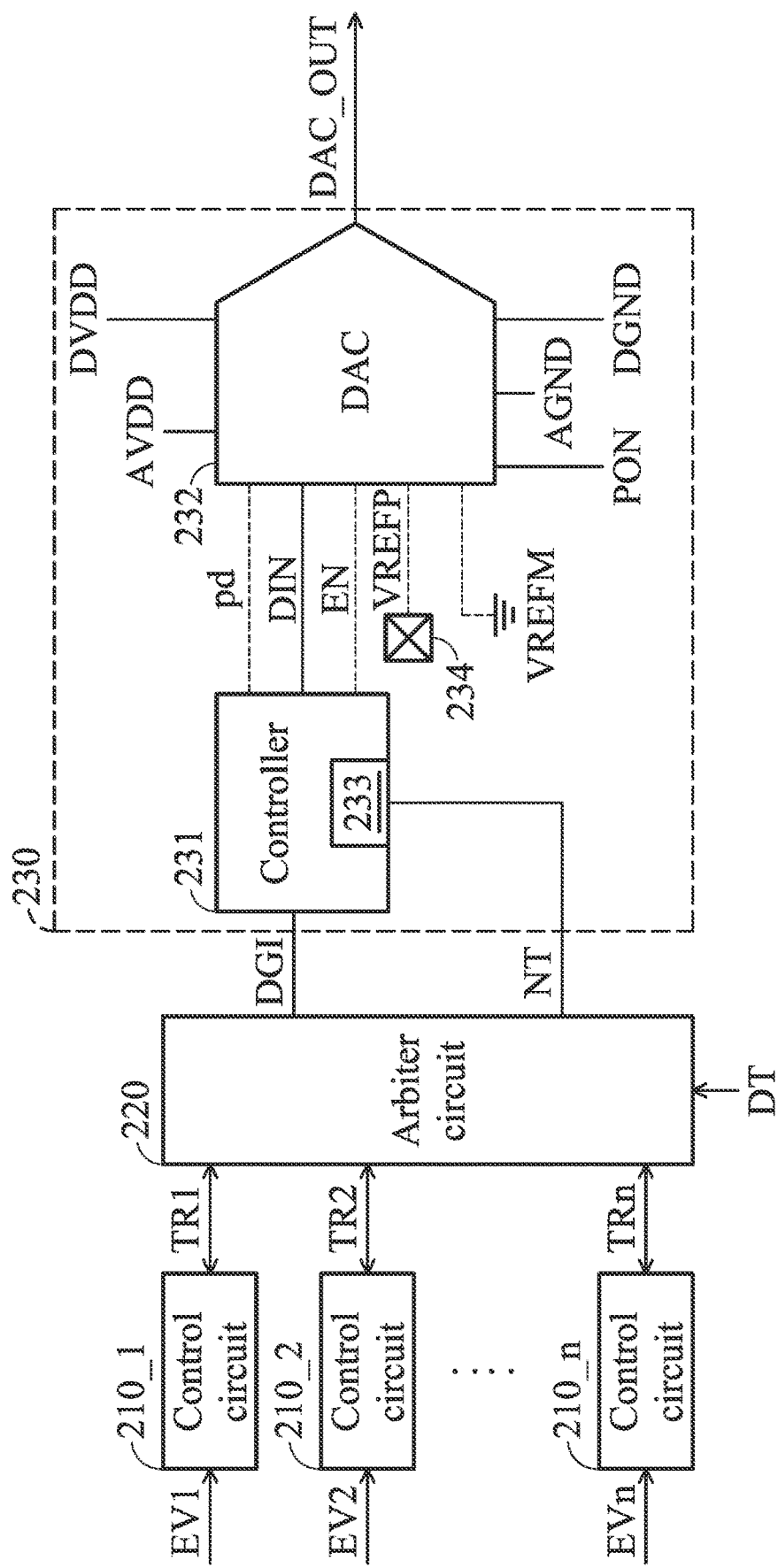
FIG. 2 is a schematic diagram of an exemplary embodiment of a signal generation circuit according to various aspects of the present disclosure.

FIG. 2 is a schematic diagram of an exemplary embodiment of the signal generation circuit according to various aspects of the present disclosure. As shown in FIG. 2, the signal generation circuit 200 comprises control circuits 210_1~210_n, an arbiter circuit 220, and a digital-to-analog converter (DAC) circuit 230. Since the operations of control circuits 210_1~210_n are the same, the control circuits 210_1 and 210_2 are provided as an example. The control circuit 210_1 stores a first string of data. The control circuit 210_2 stores a second string of data. In one embodiment, the control circuit 210_1 serves as a first data source, and the control circuit 210_2 serves as a second data source. Additionally, the control circuit 210_1 receives the event EV1, and the control circuit 210_2 receives the event EV2. When the event EV1 occurs, the control circuit 210_1 enables a trigger signal TR1. When the event EV2 occurs, the control circuit 210_2 enables a trigger signal TR2.

The arbiter circuit 220 is coupled to the control circuits 210_1~210_n to receive the trigger signals TR1~TRn. In this embodiment, the arbiter circuit 220 stores the order of priority. The order of priority relates with the priority weights of the control circuits 210_1~210_n. When many trigger signals are enabled, the arbiter circuit 220 reads a corresponding control circuit according to the order of priority to use the string of data stored in the corresponding control circuit as a digital input DGI. For example, assume that the control circuit 210_1 has the highest priority weight, the control circuit 210_2 has the second priority weight, and the control circuit 210_n has the lowest priority weight. In this case, when the trigger signals TR1 and TR2 are enabled, the arbiter circuit 220 reads the control circuit 210_1 to use the first string of data stored in the control circuit 210_1 as the digital input DGI.

In this embodiment, the arbiter circuit 220 further receive a notification signal NT. When the notification signal NT is enabled, the arbiter circuit 220 determines which trigger signal is enabled. If one trigger signal is enabled, the arbiter circuit 220 reads the string of data stored in the corresponding control circuit. If many trigger signal is enabled, the arbiter circuit 220 reads the string of data stored in the corresponding control circuit having the highest priority weight according to the order of priority. For example, if only trigger signal TR2 is enabled, the arbiter circuit 220 reads the string of data stored in the control circuit 2102 to update the digital input DGI. The arbiter circuit 220 may directly use the second string of data stored in the control circuit 210_2 as the digital input DGI. However, after the notification signal NT is enabled, the trigger signals TR1 and TR2 may be enabled. In this case, since the priority weight of the control circuit 210_1 is higher than the priority weight of the control circuit 210_2, the arbiter circuit 220 still reads the string of data stored in the control circuit 210_1 and uses the string of data stored in the control circuit 210_1 as the digital input DGI. In some embodiments, if only one trigger signal is enabled, the arbiter circuit 220 uses the string of data stored in the corresponding control circuit as the digital input DGI.

In one embodiment, after the arbiter circuit 220 uses the first string of data stored in the control circuit 210_1 as the digital input DGI, the arbiter circuit 220 stores the data string DT provided by the external peripheral circuit (e.g., 150) to the control circuit 210_1 to update the data string in the control circuit 210_1. Since the CPU 110 has stored the data strings to be provided to the control circuits 210_1~210_n in the memory 151, after the arbiter circuit 220 outputs the corresponding data string, the peripheral circuit 150 updates the data string of the corresponding control circuit via the arbiter circuit 220. In other embodiments, the peripheral circuit 150 may directly provide the data string DT to the corresponding control circuit.

The DAC circuit 230 converts the digital input DGI to generate the analog output DAC_OUT. The structure of the DAC circuit 230 is not limited in the present disclosure. In this embodiment, the DAC circuit 230 comprises a controller 231 and a DAC 232. The controller 231 generates output data DIN according to the digital input DGI. In one embodiment, the controller 231 is a DAC controller. The DAC 232 converts the input data DIN to generate the analog output DAC_OUT. In one embodiment, the DAC 232 is a resistive DAC (RDAC).

In other embodiments, the controller 231 comprises a counter circuit 233. When the DAC 232 starts to convert the input data DIN, the counter circuit 233 performs a counting operation. When the duration for which the counter circuit 233 performs the counting operation arrives a set time (e.g., 5 sec), it means that the DAC 232 finishes the conversion operation. Therefore, the counter circuit 233 enables the notification signal NT to direct the arbiter circuit 220 to read the corresponding control circuit according to the trigger signals TR1~TRn and the priority weights of the control circuits 210_1~210_n. In some embodiments, the counter circuit 233 may be disposed independent of the controller 231.

In one embodiment, the controller 231 further provides a power-down signal pd to the DAC 232. When the power-down signal pd is enabled, the DAC 232 stops operating. At this time, the DAC 232 may enter a power-down mode. Additionally, the controller 231 may provide a turning-on signal EN to activate the DAC 232.

In other embodiments, the DAC 232 further receives operation voltages AVDD, DVDD, AGND, and DGND. The operation voltages AVDD and AGND are provided to the analog elements in the DAC 232. The operation voltage AVDD is higher than the operation voltage AGND. The operation voltages DVDD and DGND are provided to the digital elements in the DAC 232. The operation voltage DVDD is higher than the operation voltage DGND.

In some embodiments, the DAC 232 further receives a power-on control signal PON. When the operation voltages AVDD, DVDD, AGND, and DGND are unstable, the power-on control signal PON is disabled. Therefore, the DAC 232 does not operate. When the operation voltages AVDD, DVDD, AGND, and DGND are stable, the power-on control signal PON is enabled. Therefore, the DAC 232 starts to operate.

In other embodiments, the DAC 232 further receives reference voltages VREFP and VREFM. The reference voltage VREFP may be provided from a specific pin 234. The DAC 232 may comprise a resistor string. The resistor string receives the reference voltages VREFP and VREFM and divides the reference voltage VREFP to generate many divided voltages. In one embodiment, the DAC 232 selects a corresponding divided voltage according to the input data DIN and serves the corresponding divided voltage as the analog output DAC_OUT.

In an initial period, the CPU 110 activates the DAC circuit 230. Therefore, the DAC circuit 230 starts operate. In an operation period, the CPU does not intervene the operations of the control circuits 210_1~210_n, the arbiter circuit 220, and the DAC circuit 230. In this period, the CPU 110 may operate in a power-down mode. In other embodiments, when the control circuits 210_1~210_n, the arbiter circuit 220, and the DAC circuit 230 operate, the CPU 110 is in an idle state.

Additionally, in the operation period, when the trigger signal TR1 is enabled and the trigger signals TR2~TRn are not enabled, the arbiter circuit 220 reads the control circuit 210_1 to retrieve the string of data (referred to as first string of data) stored in the control circuit 210_1 and serve the string of data stored in the control circuit 210_1 as the digital input DGI. At this time, when the arbiter circuit 220 serves the first string of data as the digital input DGI, the control circuit 210_1 reads and stores the string of data (referred to as a third string of data) stored in an external memory (e.g., 151).

In the operation period, when the trigger signal TR2 is enabled and the trigger signals TR1 and TR3~TRn are not enabled, the arbiter circuit 220 reads the control circuit 210_2 to retrieve the string of data (referred to as a second string of data) stored in the control circuit 210_2 and serve the second string of data as the digital input DGI. At this time, when the arbiter circuit 220 serves the second string of data as the digital input DGI, the control circuit 210_2 reads and stores the string of data (referred to as a fourth string of data) stored in the external memory.

Figure 3:
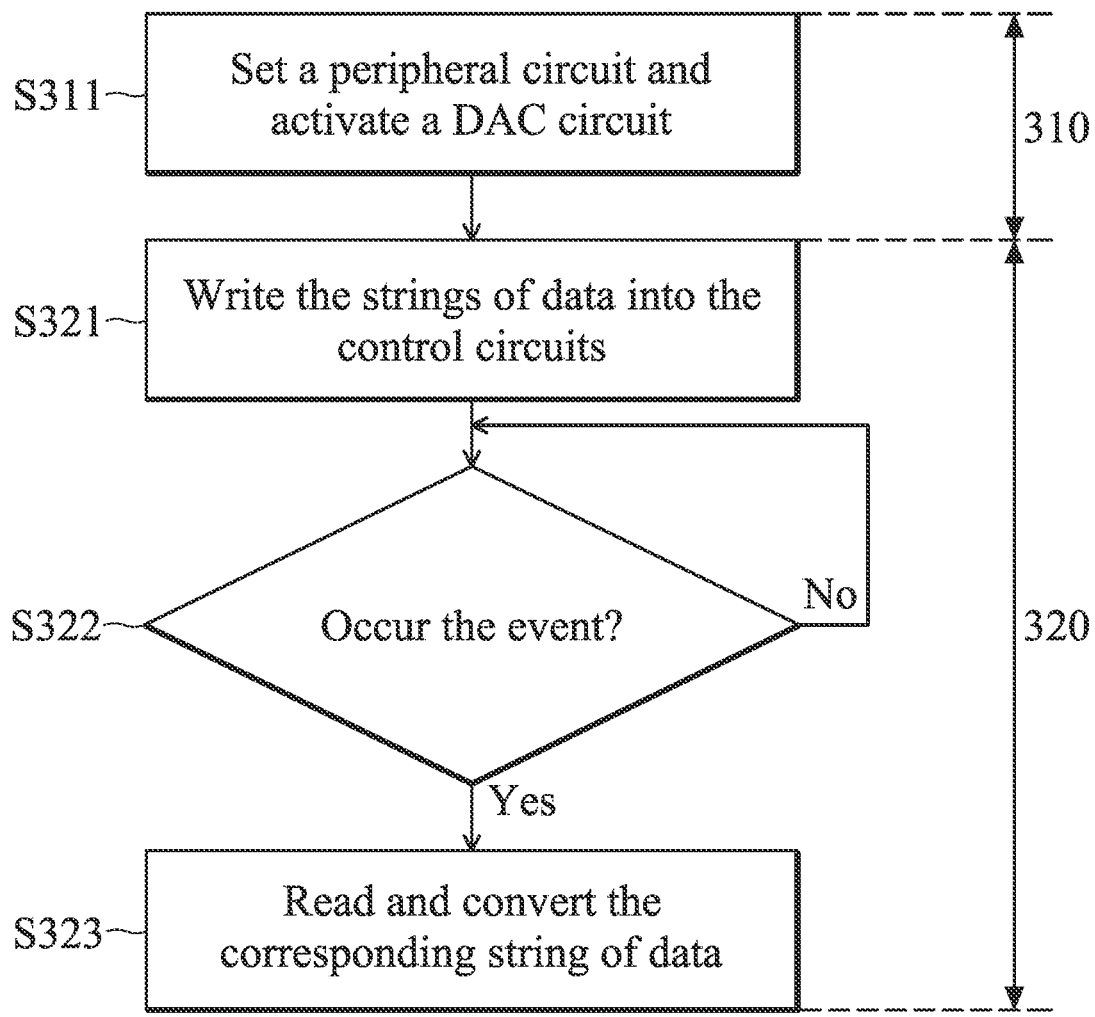
FIG. 3 is a flowchart of an exemplary embodiment of a control method of the micro-controller according to various aspects of the present disclosure.

FIG. 3 is a flowchart of an exemplary embodiment of a control method of the micro-controller according to various aspects of the present disclosure. In an initial period 310, step S311 is performed. In an operation period, steps S321~323 are performed. Step S311 is to set a peripheral circuit by a CPU and activate a DAC circuit. Step S321 is to write the string of data into a corresponding control circuit. Step S322 is to determine whether an event occurs. When an event occurs, step S323 reads and convers the string of data stored in a corresponding control circuit.

Taking FIG. 1 as an example, the CPU 110 sets the peripheral circuit 120 and activates the DAC circuit of the signal generation circuit 140 in step S311. The invention does not limit how the CPU 110 sets the peripheral circuit 120. In one embodiment, the CPU 110 sets the values of the registers of the peripheral circuit 120. In this case, the peripheral circuit 120 operates according to the values of registers.

Taking FIG. 2 as an example, step S321 writes the strings of data into the control circuits 210_1~210_*n*. Step S322 determines whether the events EV1~EVn occur according to the trigger signals TR1~TRn. For example, when the trigger signal TR1 is enabled, it means that the event EV1 occurs. Similarly, when the trigger signal TR2 is enabled, it means that the event EV2 occurs. Step S323 converts the corresponding string of data according to the occurrence of the event to generate an analog output. For example, when the event EV1 occurs and the events EV2~EVn do not occur, the arbiter circuit 220 serves the string of data (referred to as a first string of data) of the control circuit 210_1 as a digital input DGI. The DAC circuit 230 converts the digital input DGI to generate the analog output DAC_OUT. Similarly, if only the event EV2 occurs, the arbiter circuit 220 serves the string of data (referred to as a second string of data) of the control circuit 210_2 as a digital input DGI.

However, when many trigger signals are enabled, step S323 reads a corresponding control circuit according to the order of priority. For example, when the trigger signals TR1 and TR2 are enabled, if the order of priority indicates that the priority weight of the control circuit 210_1 is higher than the priority weight of the control circuit 210_2, the arbiter circuit 220 serves the string of data stored in the control circuit 210_1, which has a high priority weight as the digital input DGI. In this case, the order of priority may be stored outside of the arbiter circuit 220 or stored in a memory disposed outside of the arbiter circuit 220. In other embodiments, after the arbiter circuit 220 serves the string of data stored in the control circuit 210_1 as the digital input DGI, if the trigger signals TR1 and TR2 are still enabled, the arbiter circuit 220 serves the string of data stored in the control circuit 210_1 as the digital input DGI again. In this case, after the arbiter circuit 220 serves the string of data stored in the control circuit 210_1 as the digital input DGI, if only the trigger signal TR2 is enabled, the arbiter circuit 220 serves the string of data stored in the control circuit 210_2 as the digital input DGI.

In this embodiment, the operations of steps S321~S323 do not require support from the CPU 110 in the operation period 320. Therefore, the CPU can enter an idle mode or an power-down mode in the operation period 320. In other embodiments, when the DAC circuit 230 converts the digital input DGI, step S323 updates the string of data stored in the corresponding control circuit.

For example, when the arbiter circuit 220 serves the string of data stored in the control circuit 210_1 as the digital input DGI, step S323 writes a new string of data (referred to as a third string of data) to the control circuit 210_1. Similarly, when the arbiter circuit 220 serves the string of data stored in the control circuit 210_2 as the digital input DGI, step S323 writes a new string of data (referred to as a fourth string of data) in the control circuit 210_2.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a micro-controller for practicing the methods. The control methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a micro-controller for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:
1. A signal generation circuit comprising:
a first control circuit storing a first string of data, wherein the first control circuit enables a first trigger signal in response to a first event occurring;

a second control circuit storing a second string of data, wherein the second control circuit enables a second trigger signal in response to a second event occurring;

an arbiter circuit reading one of the first and second control circuits according to an order of priority to use the first string of data or the second string of data as a digital input in response to the first and second trigger signals being enabled; and a digital-to-analog converter (DAC) circuit converting the digital input to generate an analog output and comprising:

a counter circuit performing a counting operation, wherein in response to the duration when the counter circuit performs the counting operation arriving a set time, the counter circuit enables a notification signal to direct the arbiter circuit to read one of the first and second control circuits according the first and second trigger signals.

2. The signal generation circuit as claimed in claim 1, wherein in response to the first trigger signal being enabled and the second trigger signal not being enabled, the arbiter circuit reads the first control circuit to use the first string of data as the digital input.

3. The signal generation circuit as claimed in claim 2, wherein in response to the arbiter circuit using the first string of data as the digital input, the first control circuit stores a third string of data provided by an external memory.

4. The signal generation circuit as claimed in claim 3, wherein in response to the second trigger signal being enabled and the first trigger signal not being enabled, the arbiter circuit reads the second control circuit to use the second string of data as the digital input.

5. The signal generation circuit as claimed in claim 4, wherein in response to the arbiter circuit using the second string of data as the digital input, the second control circuit stores a fourth string of data provided by the external memory.

6. The signal generation circuit as claimed in claim 1, wherein after the DAC circuit generates the analog output, the arbiter circuit reads one of the first and second control circuits according to the first and second trigger signals to update the digital input.

7. The signal generation circuit as claimed in claim 6, wherein the DAC circuit comprises:
a controller generating input data according to the digital input; and
a resistive DAC converting the digital input to generate the analog output.

8. A micro-controller comprising:
a central processing unit (CPU);
a first peripheral circuit coupled to the CPU;
a first control circuit coupled to the first peripheral circuit and storing a first string of data, wherein in response to a first event occurring in the first peripheral circuit, the first control circuit enables a first trigger signal;
a second control circuit coupled to the first peripheral circuit and storing a second string of data, wherein in response to a second event occurring in the first peripheral circuit, the second control circuit enables a second trigger signal;
an arbiter circuit reading one of the first and second control circuits according to an order of priority to use the first string of data or the second string of data as a digital input in response to the first and second trigger signals being enabled;

a digital-to-analog converter (DAC) circuit converting the digital input to generate an analog output and comprising:
a counter circuit performing a counting operation; and
a second peripheral circuit operating according to the analog output,
wherein in response to the duration when the counter circuit performs the counting operation arriving a set time, the counter circuit enables a notification signal to direct the arbiter circuit to read one of the first and second control circuits according the first and second trigger signals.

9. The micro-controller as claimed in claim 8, wherein:
in an initial period, the CPU sets the first peripheral circuit and the DAC circuit, and
in an operation period, the first peripheral circuit, the first control circuit, the second control circuit, the arbiter circuit, and the DAC circuit start to operate, and
in the operation period, the first control circuit, the second control circuit, the arbiter circuit, and the DAC circuit operate without depending on the CPU.

10. The micro-controller as claimed in claim 9, wherein in the operation period, the CPU operates in a power-down mode.

11. The micro-controller as claimed in claim 8, further comprising:
a third peripheral circuit configured to provide the first string of data and the second string of data to the first control circuit and the second control circuit.

12. The micro-controller as claimed in claim 11, wherein:
in response to the arbiter circuit using the first string of data as the digital input, the third peripheral circuit provides a third string of data to the first control circuit, and
in response to the arbiter circuit using the second string of data as the digital input, the third peripheral circuit provides a fourth string of data to the second control circuit.

13. The micro-controller as claimed in claim 8, wherein:
in response to the first trigger signal being enabled and the second trigger signal not being enabled, the arbiter circuit reads the first control circuit to use the first string of data as the digital input, and
in response to the second trigger signal being enabled and the first trigger signal not being enabled, the arbiter circuit reads the second control circuit to use the second string of data as the digital input.

14. The micro-controller as claimed in claim 8, wherein after the DAC circuit generates the analog output, the arbiter circuit reads one of the first control circuit and the second control circuit according to the first trigger signal and the second trigger signal to update the digital input.

15. A control method applied in a micro-controller comprising a central processing unit (CPU), comprising:
in an initial period:
utilizing the CPU to set a first peripheral circuit and activating a digital-to-analog converter (DAC) circuit;
in an operation period:
writing a first string of data to a first control circuit;
writing a second string of data to a second control circuit;
enabling a first trigger signal in response to a first event occurring in the first peripheral circuit;
enabling a second trigger signal in response to a second event occurring in the first peripheral circuit;
reading one of the first control circuit and the second control circuit according to an order of priority to use the first string of data or the second string of data as a digital input in response to the first and second trigger signals being enabled;

converting the digital input to an analog output;

performing a counting operation in response to the digital input being converted; and reading one of the first and second control circuits according the first and second trigger signals in response to the duration of the counting operation arriving a set time.

16. The control method as claimed in claim 15, wherein the step of reading one of the first control circuit and the second control circuit according to the order of priority to use the first string of data or the second string of data as a digital input do not require support from the CPU.

17. The control method as claimed in claim 15, wherein:

in response to the first trigger signal being enabled and the second trigger signal not being enabled, the first control circuit is read to use the first string of data as the digital input, and in response to the second trigger signal being enabled and the first trigger signal not being enabled, the second control circuit is read to use the second string of data as the digital input.

18. The control method as claimed in claim 17, wherein the step of reading one of the first control circuit and the second control circuit does not require support from the CPU.

19. The control method as claimed in claim 15, further comprising:

reading a second peripheral circuit to obtain a third string of data in response to the first string of data being used as the digital input;

reading the second peripheral circuit to obtain a fourth string of data in response to the second string of data being used as the digital input;

storing the third string of data in the first control circuit; and storing the fourth string of data in the second control circuit.

\* \* \* \* \*